United States Patent
Ando et al.

(10) Patent No.: US 11,378,598 B2
(45) Date of Patent: Jul. 5, 2022

(54) SEMICONDUCTOR INTEGRATED CIRCUIT DEVICE AND CURRENT DETECTION CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tomohiro Ando, Kanagawa (JP); Kazuhiro Taguchi, Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 136 days.

(21) Appl. No.: 17/002,097

(22) Filed: Aug. 25, 2020

(65) Prior Publication Data
US 2021/0278445 A1 Sep. 9, 2021

(30) Foreign Application Priority Data
Mar. 5, 2020 (JP) .............................. JP2020-037780

(51) Int. Cl.
*G01R 19/10* (2006.01)
*H03F 3/45* (2006.01)

(52) U.S. Cl.
CPC ......... *G01R 19/10* (2013.01); *H03F 3/45475* (2013.01)

(58) Field of Classification Search
CPC ..... G01R 19/10; H03F 3/45475; H01L 23/58; H01L 23/64
See application file for complete search history.

(56) References Cited

U.S. PATENT DOCUMENTS

| 5,814,995 A * | 9/1998 | Tasdighi | G01R 17/16 324/433 |
| 8,040,650 B2 * | 10/2011 | Ueda | H03K 17/0822 361/93.1 |
| 10,050,031 B2 * | 8/2018 | Kobayashi | G01K 7/22 |
| 10,340,857 B2 * | 7/2019 | Matsuno | H03F 3/4521 |

FOREIGN PATENT DOCUMENTS

| JP | 2004032641 A | 1/2004 |
| JP | 2005295360 A | 10/2005 |
| JP | 2010220394 A | 9/2010 |

* cited by examiner

*Primary Examiner* — Vinh P Nguyen
(74) *Attorney, Agent, or Firm* — Holtz, Holtz & Volek PC

(57) ABSTRACT

According to an embodiment, a semiconductor integrated circuit device has a first switching element that is connected between first and second nodes, a second switching element that is connected between the first node and a third node and outputs a current that is 1/K times as much as an output current of the first switching element, and an amplifier that controls, by a signal provided by amplifying a voltage difference between the third node and a fourth node, a conduction state of a third switching element that is connected between the fourth node and a fifth node.

20 Claims, 4 Drawing Sheets

SEMICONDUCTOR INTEGRATED CIRCUIT DEVICE AND CURRENT DETECTION CIRCUIT

CROSS-REFERENCE TO RELATED APPLICATIONS

This application is based upon and claims the benefit of priority from Japanese Patent Application No. 2020-37780, filed on Mar. 5, 2020; the entire contents of which are incorporated herein by reference.

FIELD

The present embodiment generally relates to a semiconductor integrated circuit device and a current detection circuit.

BACKGROUND

A current detection circuit has conventionally been disclosed where a voltage drop that is generated by a current that flows through a load and a voltage drop that is generated by a minute current with a predetermined ratio to a load current are compared by a differential amplifier and a current that flows through a switching element that cooperates with the differential amplifier to compose a negative feedback circuit is detected. A voltage drop is generated by, for example, an external resistance element for a semiconductor integrated circuit device where a differential amplifier is formed therein. A resistance value of an external resistance element is provided with a high degree of accuracy, so that it is possible to improve an accuracy of current detection. However, a resistance element with a high degree of accuracy and a low resistance value is expensive. A needed accuracy of current detection is different according to a field of application where a current detection circuit is used therein. A semiconductor integrated circuit device and a current detection circuit are desired that are applicable to any of needs of a high accuracy and a low accuracy and capable of suppressing costs thereof.

BRIEF DESCRIPTION OF THE DRAWING(S)

DETAILED DESCRIPTION

According to one embodiment, a semiconductor integrated circuit device includes a first switching element that is provided with a main current path that is connected between a first node and a second node, and outputs a first output current, a second switching element that is provided with a main current path that is connected between the first node and a third node, and outputs a second output current that is one K-th times as much as the first output current (where K is any positive number that is greater than 1), a third switching element that is provided with a main current path that is connected between a fourth node and a fifth node, and a differential amplifier that outputs a signal provided by amplifying a voltage difference that is generated between the third node and the fourth node to control a conduction state of the third switching element.

Hereinafter, a semiconductor integrated circuit device and a current detection circuit according to embodiments will be explained in detail, with reference to the accompanying drawings. Additionally, the present invention is not limited by such an embodiment(s)

First Embodiment

Figure 1:
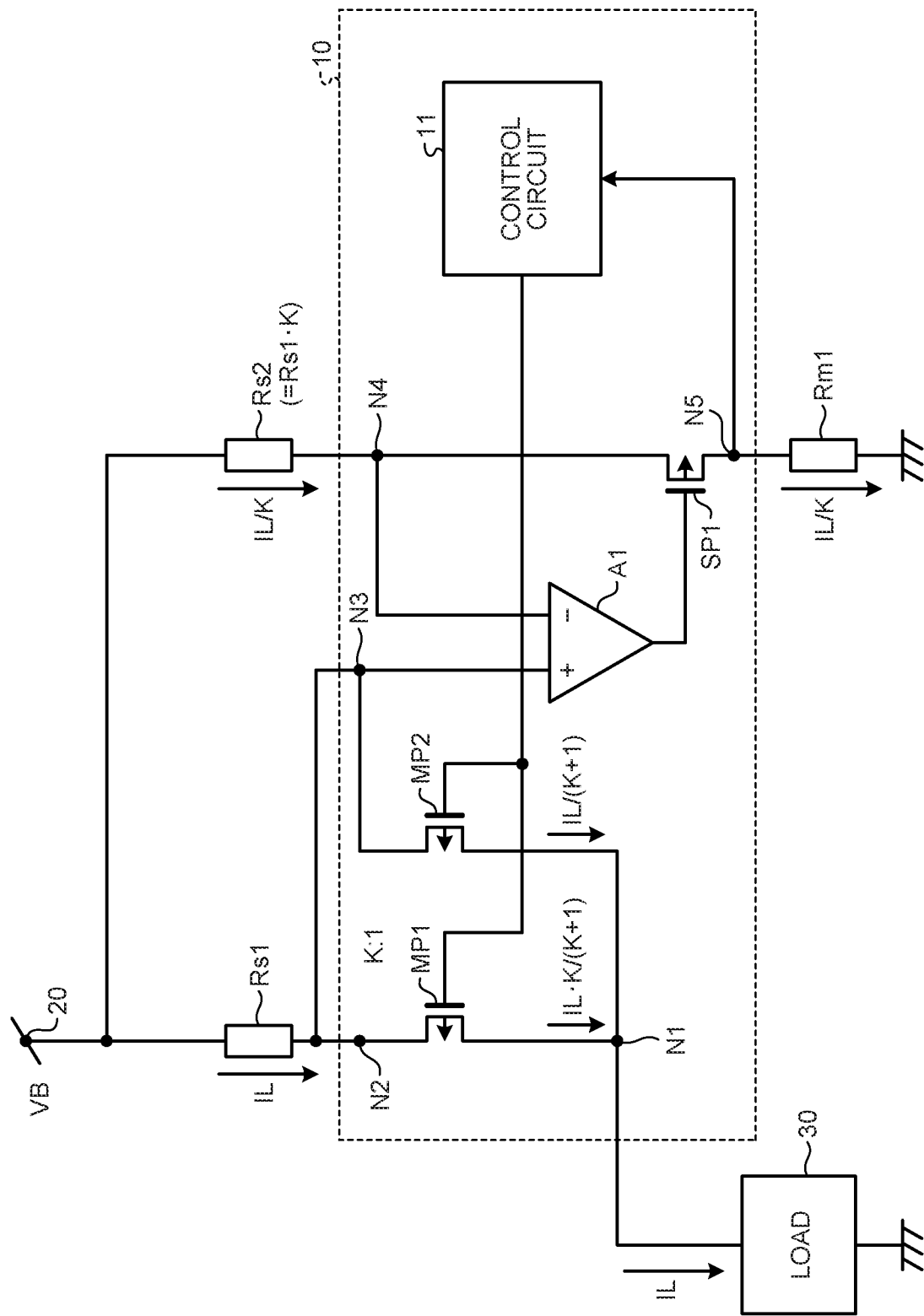
FIG. 1 is a diagram that illustrates a configuration of a current detection circuit according to a first embodiment.

FIG. 1 is a diagram that illustrates a configuration of a current detection circuit according to a first embodiment. A current detection circuit according to the present embodiment detects a current that flows thorough a load that is connected between a power source and ground. A current detection circuit in FIG. 1 includes a semiconductor integrated circuit device 10. The semiconductor integrated circuit device 10 is integrally integrated on, for example, a (non-illustrated) printed-wiring board. The semiconductor integrated circuit device 10 has a node N1 to a node N5 that are connected to an external element or the like. Each node N1 to N5 is a connection terminal, for example, a (non-illustrated) bonding pad. Alternatively, each node N1 to N5 represents a connection point of wirings. One end of a load 30 is connected to the node N1. The other end of the load 30 is grounded. FIG. 1 illustrates a configuration in a case where the load 30 is connected to the semiconductor integrated circuit device 10 on a lower potential side thereof.

The semiconductor integrated circuit device 10 has PMOS transistors MP1 and MP2. A source-drain path of the transistor MP1 that is a main current path thereof is connected between the nodes N1 and N2. A source-drain path of the transistor MP2 is connected between the node N1 and the node N3. A ratio of output currents that are output by the transistors MP1 and MP2, that is, a ratio of drain currents thereof, is set at K:1. It is possible to set a ratio of output currents by providing a ratio of sizes of the transistors MP1 and MP2 as K:1. For example, a value of K is set at 10000.

The semiconductor integrated circuit device 10 has a differential amplifier A1 and a PMOS transistor SP1.

A non-inverting input end (+) of the differential amplifier A1 is connected to the node N3 and an inverting input end (−) thereof is connected to the node N4. A source-drain path of the PMOS transistor SP1 that is a main current path thereof is connected between the nodes N4 and N5. The differential amplifier A1 amplifies a voltage difference between the nodes N3 and N4 and supplies it to a gate of the transistor SP1. An output of the differential amplifier A1 controls a conduction state of the transistor SP1. The differential amplifier A1 and the transistor SP1 compose a negative feedback circuit that is operated in such a manner that voltages at the node N3 and the node N4 are equalized.

The nodes N2 and N3 are connected to one end of a detection resistor Rs1. The other end of the detection resistor Rs1 is connected to a power source terminal 20 where a power source voltage VB is applied thereto. The detection resistor Rs1 is set at, for example, a resistance value of several mΩ to several hundred mΩ. The node N4 is connected to one end of a detection resistor Rs2. The other end of the detection resistor Rs2 is connected to the power source terminal 20. The detection resistor Rs2 is set at a resistance value that is K times as much as that of the detection resistor Rs1.

That is, a negative feedback circuit that is composed of the differential amplifier A1 and the transistor SP1 is operated in such a manner that a voltage drop that is generated at the detection resistor Rs1 and a voltage drop that is generated at the detection resistor Rs2 are equalized. Therefore, in a case where a resistance value of the detection resistor Rs2 is K times as much as a resistance value of the detection resistor Rs1, a load current IL flows through the detection resistor Rs1 and a current IL/K flows through the detection resistor Rs2.

A current that flows through the detection resistor Rs2 is output from the node N5 through the transistor SP1 and is supplied to one end of a monitor resistor Rm1. The other end of the monitor resistor Rm1 is grounded. A current that flows through the monitor resistor Rm1 is nearly equal to a current that flows through the detection resistor Rs2. Therefore, it is possible to detect a voltage drop that is generated at the monitor resistor Rm1 by detecting a voltage at the node N5, and hence, it is possible to detect a load current IL.

A voltage at the node N5 is supplied to a control circuit 11. The control circuit 11 controls on/off of the transistors MP1, MP2. As the transistors MP1, MP2 are turned on, a load current IL is supplied to the load 30. For example, in a case where a voltage at the node N5 rises through a predetermined threshold value, the control circuit 11 executes control to turn off the transistors MP1, MP2. By such control, it is possible to protect the load 30 from an overcurrent state thereof.

According to a first embodiment, the detection resistors Rs1 and Rs2 are respectively connected between the node N2 of the semiconductor integrated circuit device 10 and the power source terminal 20 and between the node N4 thereof and the power source terminal 20. The detection resistor Rs2 is set at a resistance value that is K times as much as that of the detection resistor Rs1, so that it is possible to compose a current detection circuit that detects a current that is 1/K times as much as a load current IL. The differential amplifier A1 and the transistor SP1 execute a negative feedback operation in such a manner that voltages at the node N3 and the node N4 are equalized. Voltages at the nodes N3, N4 depend on the detection resistors Rs1 and Rs2. Therefore, the detection resistor Rs1 with a high degree of accuracy where a tolerance is ± several % is connected thereto, so that it is possible to provide a current detection circuit with a high degree of accuracy. Additionally, a recommended resistance element (the detection resistor Rs1, Rs2) is provided to a user of the semiconductor integrated circuit device 10 as a standard specification, so that selection of a resistance element that is used at a time when such a user composes a current detection circuit with a high degree of accuracy by using the semiconductor integrated circuit device 10 is facilitated and hence it is possible to attain convenience of such a user. Furthermore, a current IL/K flows through the detection resistor Rs2. Therefore, even if a resistance value of the detection resistor Rs2 is increased, a square of suppression of a current value contributes to power consumption at the detection resistor Rs2, and hence, it is possible to suppress an increase in power consumption greatly.

Second Embodiment

Figure 2:
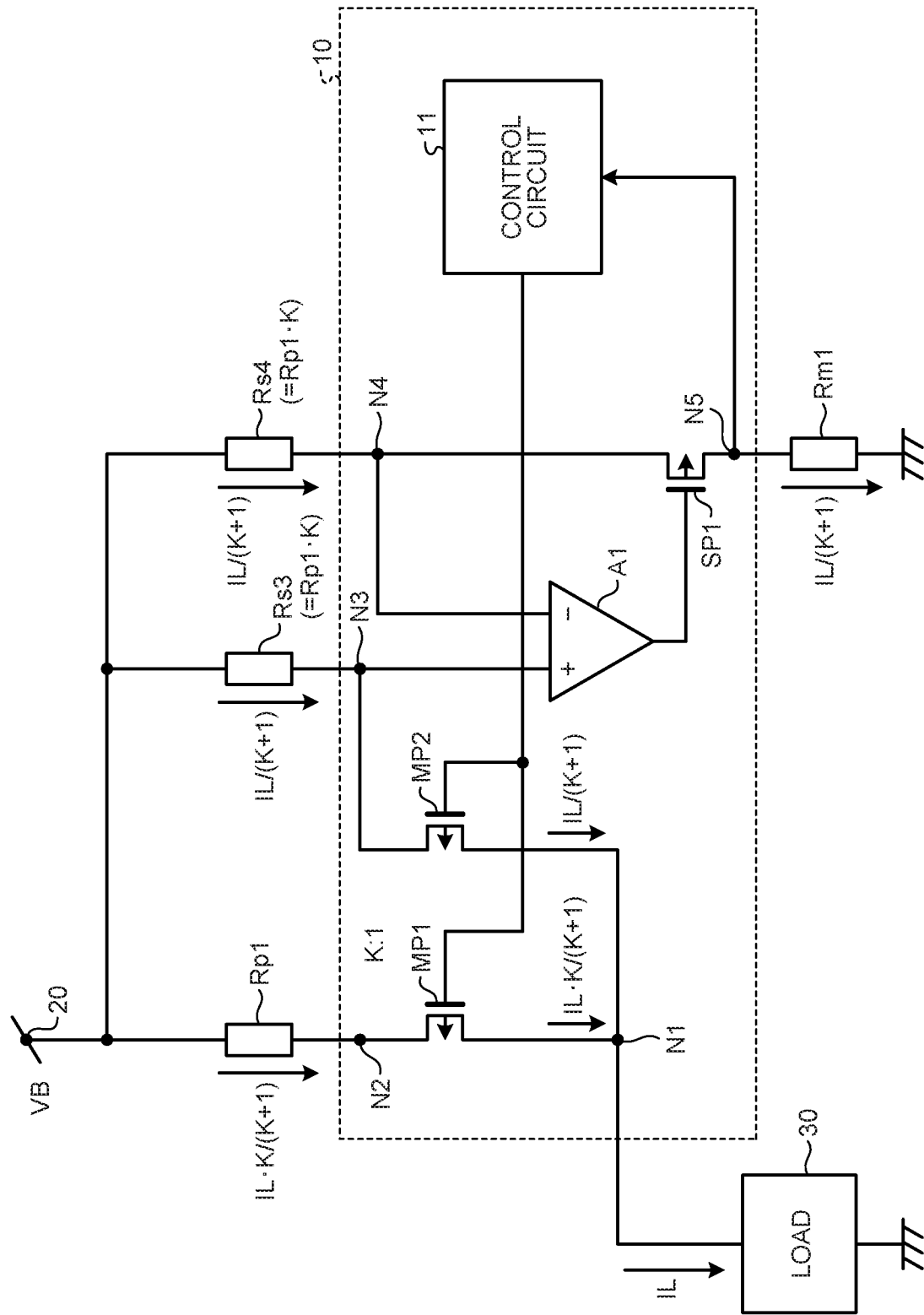
FIG. 2 is a diagram that illustrates a configuration of a current detection circuit according to a second embodiment.

FIG. 2 is a diagram that illustrates a configuration of a current detection circuit according to a second embodiment. A component that corresponds to that of an embodiment as already described is provided with an identical sign and a duplicative description is provided only in a case of need. Hereinafter, the same applies. A current detection circuit in FIG. 2 has a connection means Rp1 that connects a node N2 to a power source terminal 20. The connection means Rp1 is, for example, a wiring or a bonding wire that connects a source of a transistor MP1 to the power source terminal 20 on a (non-illustrated) printed-wiring board. The connection means Rp1 has, for example, a resistance value that is provided by a wiring, and is conveniently illustrated as a resistor that has a resistance value Rp1 in the present embodiment. Additionally, the connection means Rp1 may be configured to include a resistance element that has a predetermined resistance value.

A node N3 is connected to one end of a detection resistor Rs3. The other end of the detection resistor Rs3 is connected to the power source terminal 20. The detection resistor Rs3 is set at a resistance value that is K times as much as that of the connection means Rp1. A node N4 is connected to one end of a detection resistor Rs4. The other end of the detection resistor Rs4 is connected to the power source terminal 20. The detection resistor Rs4 is similarly set at a resistance value that is K times as much as that of the connection means Rp1.

A current ratio between transistors MP1 and MP2 is set at K:1. Therefore, a current IL·K/(K+1) flows through the connection means Rp1 and a current IL/(K+1) flows through the detection resistor Rs3. Thereby, voltage drops at the connection means Rp1 and the detection resistor Rs3 are equalized, and hence, source-drain voltages and gate-source voltages of the transistors MP1, MP2 are equalized respectively. Hence, it is possible to divide a load current IL into currents on the transistors MP1 and MP2 accurately.

A negative feedback circuit is composed of a differential amplifier A1 and a transistor SP1. A negative feedback circuit is operated in such a manner that voltages at the node N3 and the node N4 are equalized. Therefore, in a case where resistance values of the detection resistor Rs3 and the detection resistor Rs4 are identical, a current with a value that is identical to that of a current that flows through the detection resistor Rs3, that is, a current IL/(K+1), flows through the detection resistor Rs4. A current that flows through a monitor resistor Rm1 is nearly equal to a current that flows through the detection resistor Rs4. Hence, it is possible to detect a current that is 1/(K+1) times as much as a load current IL by detecting a voltage at a node N5.

According to the present embodiment, a current that flows through the detection resistor Rs3 is suppressed so as to be 1/(K+1) times as much as a load current IL. For example, as a value of K is set at 10000, a current that is approximately 1/10000 times as much as a load current IL flows through the detection resistor Rs3. The connection means Rp1 is, for example, of a resistance of a wiring, and is several mΩ to several dozen mΩ. Therefore, in a case where a value of K is 10000, it is possible to use a resistance element with approximately several dozen Ω to several hundred Ω as the detection resistor Rs3. The same also applies to the detection resistor Rs4. A resistance element with a high resistance value and a low accuracy is comparatively inexpensive. Therefore, it is possible to use a comparatively inexpensive resistance element as the detection resistor Rs3, Rs4, and hence, it is possible to suppress a cost thereof.

Even if resistance values of the detection resistors Rs3, Rs4 are increased, a square of suppression of a current value contributes to power consumption at the detection resistors Rs3, Rs4, and hence, it is possible to suppress an increase in power consumption greatly. Furthermore, a semiconductor integrated circuit device 10 has a configuration that is identical to that of the semiconductor integrated circuit device 10 in FIG. 1. Therefore, it is possible for the semiconductor integrated circuit device 10 to compose a desired current detection circuit by changing connection of a resistance element or the like, and hence, volume discount that is provided by mass production is allowed.

Third Embodiment

Figure 3:
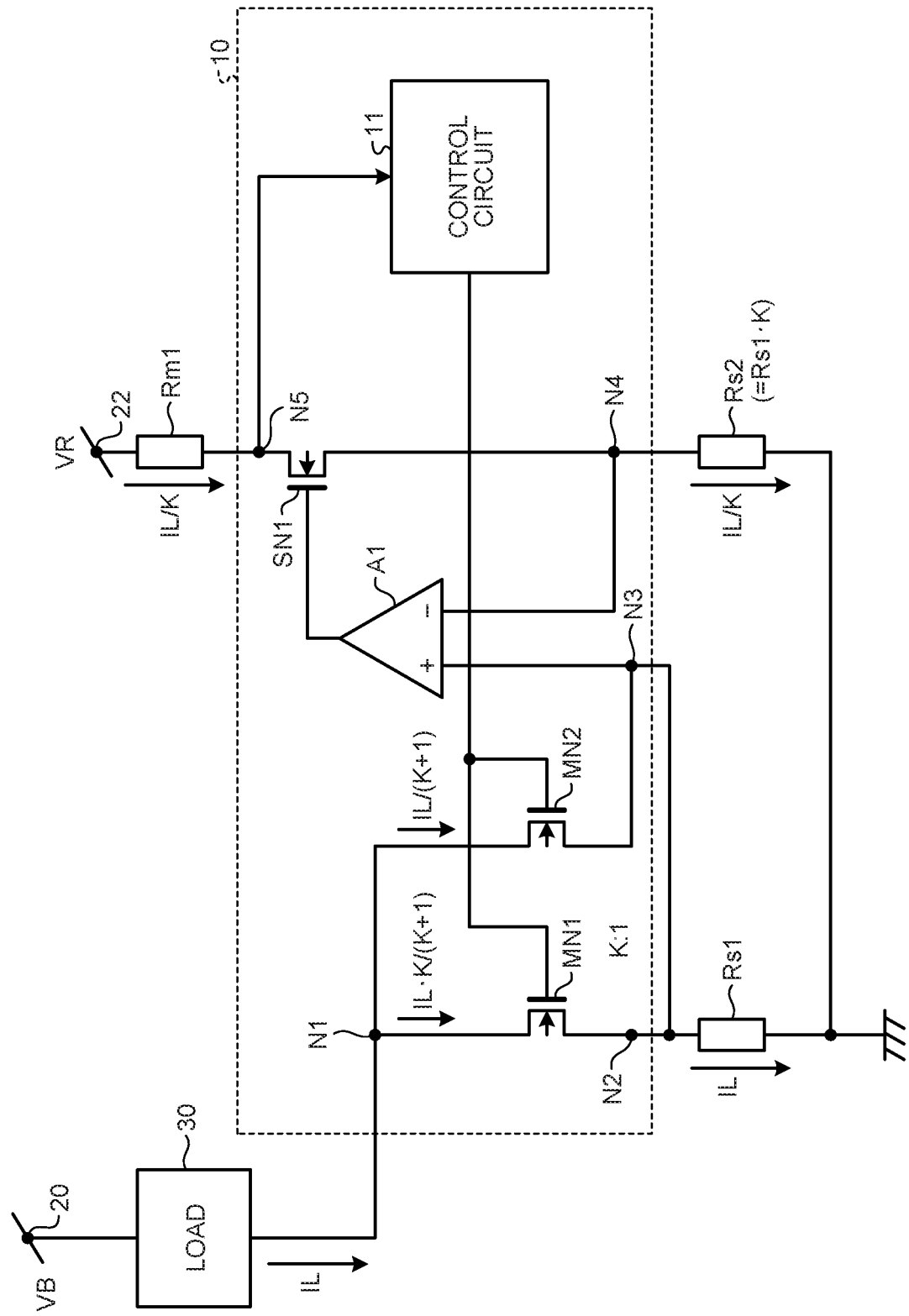
FIG. 3 is a diagram that illustrates a configuration of a current detection circuit according to a third embodiment.

FIG. 3 is a diagram that illustrates a configuration of a current detection circuit according to a third embodiment. A current detection circuit in FIG. 3 represents a configuration in a case where a load 30 is connected to a semiconductor integrated circuit device 10 on a higher potential side thereof.

The semiconductor integrated circuit device 10 has NMOS transistors MN1 and MN2. A source-drain path of the NMOS transistor MN1 is connected between nodes N1 and N2. A source-drain path of the transistor MN2 is connected between the node N1 and a node N3. A ratio of output currents that are output by the transistors MN1 and MN2 (a ratio of drain currents) is set at K:1. It is possible to set a ratio of output currents by providing a ratio of sizes of the transistors MN1 and MN2 as K:1. For example, a value of K is set at 10000.

The semiconductor integrated circuit device 10 has a differential amplifier A1 and a NMOS transistor SN1. A non-inverting input end (+) of the differential amplifier A1 is connected to the node N3 and an inverting input end (−) thereof is connected to a node N4. A source-drain path of the transistor SN1 is connected between nodes N4 and N5. The differential amplifier A1 amplifies a voltage difference between the nodes N3 and N4 and supplies it to the transistor SN1. An output of the differential amplifier A1 controls a conduction state of the transistor SN1. The differential amplifier A1 and the transistor SN1 compose a negative feedback circuit that is operated in such a manner that voltages at the node N3 and the node N4 are equalized.

The node N2 is connected to one end of a detection resistor Rs1. The other end of the detection resistor Rs1 is grounded. A resistance value of the detection resistor Rs1 is set at, for example, several mΩ to several hundred mΩ. The node N4 is connected to one end of a detection resistor Rs2. The other end of the detection resistor Rs2 is grounded. The detection resistor Rs2 is set at a resistance value that is K times as much as that of the detection resistor Rs1.

A negative feedback circuit that is composed of the differential amplifier A1 and the transistor SN1 is operated in such a manner that voltage drops that are generated at the detection resistor Rs1 and the detection resistor Rs2 are equalized. Therefore, in a case where a resistance value of the detection resistor Rs2 is K times as much as that of the detection resistor Rs1, a load current IL flows through the detection resistor Rs1 and a current IL/K flows through the detection resistor Rs2.

The node N5 is connected to one end of a monitor resistor Rm1. The other end of the monitor resistor Rm1 is connected to a power source terminal 22 where a voltage VR is applied thereto. A voltage VR is set at, for example, a voltage value that is lower than a power source voltage VB. A power source voltage VB is set at a high voltage of approximately 40 V in a case where the load 30 is, for example, a motor. A voltage VR is provided as a low voltage of approximately 5 V that is needed to operate the differential amplifier A1, so that it is possible to provide a configuration to suppress power consumption.

As the transistor SN1 is turned on, a current that is nearly equal to a current that flows through the detection resistor Rs2 is supplied to the monitor resistor Rm1. A current that flows through the detection resistor Rs2 is proportional to a load current IL, and hence, it is possible to detect a voltage drop that is generated at the monitor resistor Rm1 by detecting a voltage at the node N5. That is, it is possible to detect a load current IL by monitoring a voltage at the node N5.

A voltage at the node N5 is supplied to a control circuit 11. The control circuit 11 controls on/off of the transistors MN1, MN2. As the transistors MN1, MN2 are turned on, a load current IL is supplied to the load 30. For example, in a case where a voltage at the node N5 falls through a predetermined threshold value, the control circuit 11 executes control to turn off the transistors MN1, MN2. By such control, it is possible to protect the load 30 from an overcurrent state thereof.

According to a third embodiment, the detection resistors Rs1 and Rs2 are respectively connected between the node N2 of the semiconductor integrated circuit device 10 and a ground terminal and between the node N4 thereof and such a ground terminal. A resistance value of the detection resistor Rs2 is set at a resistance value that is K times as much as that of the detection resistor Rs1, so that it is possible to compose a current detection circuit that detects a current that is 1/K times as much as a load current IL. The differential amplifier A1 and the transistor SN1 that are integrated in the semiconductor integrated circuit device 10 execute a negative feedback operation in such a manner that a voltage at the node N3 and a voltage at the node N4 are equalized. A voltage at the node N3 and a voltage at the node N4 depend on the detection resistors Rs1 and Rs2. Therefore, in a case where current detection with a high degree of accuracy is needed, the detection resistor Rs1 with a high degree of accuracy where a tolerance is ± several % is connected thereto, so that it is possible to provide a current detection circuit with a high degree of accuracy. Additionally, a recommended resistance element (the detection resistor Rs1, Rs2) is provided to a user of the semiconductor integrated circuit device 10 as a standard specification, so that selection of a resistance element that is used at a time when such a user composes a current detection circuit with a high degree of accuracy by using the semiconductor integrated circuit device 10 is facilitated, and hence, it is possible to attain convenience of such a user. Furthermore, a current IL/K flows through the detection resistor Rs2. Therefore, even if a resistance value of the detection resistor Rs2 is increased, a square of suppression of a current value contributes to power consumption at the detection resistor Rs2, and hence, it is possible to suppress an increase in power consumption greatly.

Fourth Embodiment

Figure 4:
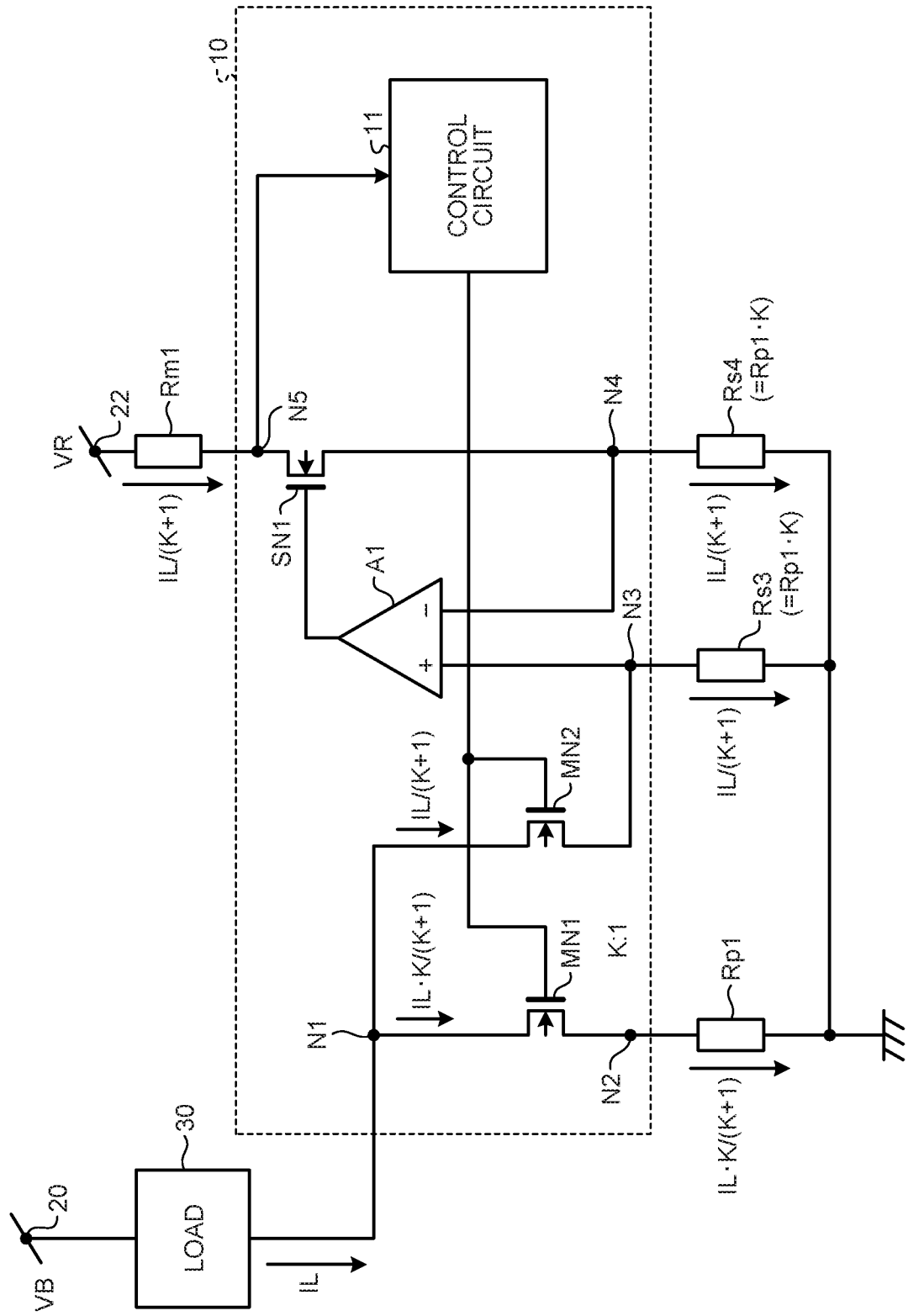
FIG. 4 is a diagram that illustrates a configuration of a current detection circuit according to a fourth embodiment.

FIG. 4 is a diagram that illustrates a configuration of a current detection circuit according to a fourth embodiment. A current detection circuit in FIG. 4 has a connection means Rp1 that connects a node N2 to a ground terminal. The connection means Rp1 is, for example, a wiring that grounds a source of a transistor MN1 on a (non-illustrated) printed-wiring board. The connection means Rp1 is conveniently illustrated as a resistor that has a resistance value Rp1.

A node N3 is connected to one end of a detection resistor Rs3, and the other end of the detection resistor Rs3 is grounded. A resistance value of the detection resistor Rs3 is set at a resistance value that is K times as much as that of the connection means Rp1. A node N4 is connected to one end of a detection resistor Rs4, and the other end of the detection resistor Rs4 is grounded. A resistance value of the detection resistor Rs4 is set at a resistance value that is K times as much as that of the connection means Rp1.

A current ratio between transistors MN1 and MN2 is set at K:1. Therefore, a current IL·K/(K30 1) flows through the connection means Rp1 and a current IL/(K+1) flows through the detection resistor Rs3. Thereby, voltage drops at the connection means Rp1 and the detection resistor Rs3 are equalized, and hence, source-drain voltages and gate-source voltages of the transistors MN1, MN2 are equalized respectively. Hence, it is possible to divide a load current IL into currents on the transistors MN1 and MN2 accurately.

A negative feedback circuit is composed of a differential amplifier A1 and a transistor SN1. A negative feedback circuit is operated in such a manner that voltages at the node N3 and the node N4 are equalized. Therefore, in a case where a resistance value of the detection resistor Rs3 and a resistance value of the detection resistor Rs4 are identical, a current with a value that is identical to that of a current that flows through the detection resistor Rs3, that is, a current IL/(K+1), flows through the detection resistor Rs4. A current that flows through a monitor resistor Rm1 is nearly equal to a current that flows through the detection resistor Rs4. Hence, it is possible to detect a current that is 1/(K+1) times as much as a load current IL by detecting a voltage at a node N5.

According to the present embodiment, a current that flows through the detection resistor Rs3 that is connected to the node N3 is suppressed so as to be a value that is 1/(K+1) times as much as a load current IL. For example, as a value of K is set at 10000, a current that is approximately 1/10000 times as much as a load current IL flows through the detection resistor Rs3. The connection means Rp1 is, for example, of a resistance of a wiring, and is several mΩ to several dozen mΩ. Therefore, in a case where a value of K is 10000, it is possible to use a resistance element with approximately several dozen Ω to several hundred Ω as the detection resistor Rs3. The same also applies to the detection resistor Rs4. A resistance element with a high resistance value and a low accuracy is comparatively inexpensive. Therefore, it is possible to use a comparatively inexpensive resistance element as the detection resistor Rs3, Rs4, and hence, it is possible to suppress a cost thereof.

Even if resistance values of the detection resistors Rs3, Rs4 are increased, a factor of a square of suppression of a current value contributes to power consumption at the detection resistors Rs3, Rs4, and hence, it is possible to suppress an increase in power consumption. Furthermore, a semiconductor integrated circuit device 10 has a configuration that is identical to that of the semiconductor integrated circuit device 10 in FIG. 3. Therefore, it is possible for the semiconductor integrated circuit device 10 to compose a desired current detection circuit by changing connection of a resistance element or the like, and hence, volume discount that is provided by mass production is allowed.

It is possible to use a GaN transistor, an SiC transistor, or an IGBT that is a high-voltage switching element as the transistor MP1, MP2, MN1, MN2. In a case where a GAN transistor or an SiC transistor is used, a source-drain path that is a main current path is composed of GaN or SiC. Furthermore, in a case where an IGBT is used, an emitter-collector path composes a main current path. A high-voltage switching element is preferable in a case where a high-voltage power source is used in order to drive the load 30. Additionally, a high-voltage switching element is formed as, for example, a separate semiconductor chip and connected to a (non-illustrated) semiconductor chip where the differential amplifier A1 is formed thereon, by a predetermined wiring, so that it is possible to form the semiconductor integrated circuit device 10 on a common printed-wiring board integrally.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit device, comprising:
a first switching element that is provided with a main current path that is connected between a first node and a second node, and outputs a first output current;
a second switching element that is provided with a main current path that is connected between the first node and a third node, and outputs a second output current that is one K-th times as much as the first output current (where K is any positive number that is greater than 1);
a third switching element that is provided with a main current path that is connected between a fourth node and a fifth node; and
a differential amplifier that outputs a signal provided by amplifying a voltage difference that is generated between the third node and the fourth node to control a conduction state of the third switching element.

2. The semiconductor integrated circuit device according to claim 1, wherein the differential amplifier and the third switching element compose a negative feedback circuit that is operated in such a manner that voltages at the third node and the fourth node are equalized.

3. The semiconductor integrated circuit device according to claim 1, comprising
a control circuit that controls on/off of the first and second switching elements in response to a voltage at the fifth node.

4. The semiconductor integrated circuit device according to claim 1, wherein the first and second switching elements are composed of PMOS transistors.

5. The semiconductor integrated circuit device according to claim 1, wherein the first and second switching elements are composed of NMOS transistors.

6. The semiconductor integrated circuit device according to claim 1, wherein the first and second switching elements are composed of GaN transistors.

7. A current detection circuit, comprising:
a first switching element that is provided with a main current path that is connected between a first node and a second node, and outputs a first output current;
a second switching element that is provided with a main current path that is connected between the first node and a third node, and outputs a second output current that is one K-th times as much as the first output current (where K is any positive number that is greater than 1);
a third switching element that is provided with a main current path that is connected between a fourth node and a fifth node;
a differential amplifier that outputs a signal provided by amplifying a voltage difference that is generated between the third node and the fourth node to control a conduction state of the third switching element;

a first resistor that is provided with one end that is connected to the second and third nodes and another end where a first voltage is applied thereto; and a second resistor that is provided with one end that is connected to the fourth node and another end where the first voltage is applied thereto, wherein the second resistor is set at a resistance value that is K times as much as that of the first resistor.

8. The current detection circuit according to claim 7, wherein the differential amplifier and the third switching element compose a negative feedback circuit that is operated in such a manner that voltages at the third node and the fourth node are equalized.

9. The current detection circuit according to claim 7, comprising:

a fifth resistor that is provided with one end that is connected to the fifth node and another end where a second voltage is applied thereto; and a control circuit that controls on/off of the first and second switching elements in response to a voltage at the fifth node.

10. The current detection circuit according to claim 7, wherein the first and second switching elements are composed of PMOS transistors.

11. The current detection circuit according to claim 7, wherein the first and second switching elements are composed of NMOS transistors.

12. The current detection circuit according to claim 7, wherein the first node is connected to a load.

13. A current detection circuit, comprising:

a first switching element that is provided with a main current path that is connected between a first node and a second node, and outputs a first output current;

a second switching element that is provided with a main current path that is connected between the first node and a third node, and outputs a second output current that is one K-th times as much as the first output current (where K is any positive number that is greater than 1);

a third switching element that is provided with a main current path that is connected between a fourth node and a fifth node;

a differential amplifier that outputs a signal provided by amplifying a voltage difference that is generated between the third node and the fourth node to control a conduction state of the third switching element;

a connection means that connects the second node to a first power source terminal;

a third resistor that is provided with one end that is connected to the third node and another end where a voltage at the first power source terminal is applied thereto; and a fourth resistor that is provided with one end that is connected to the fourth node and another end where a voltage at the first power source terminal is applied thereto, wherein the third resistor and the fourth resistor are set at identical resistance values thereof.

14. The current detection circuit according to claim 13, wherein the differential amplifier and the third switching element compose a negative feedback circuit that is operated in such a manner that voltages at the third node and the fourth node are equalized.

15. The current detection circuit according to claim 13, wherein the third resistor and the fourth resistor are set at resistance values that are K times as much as that of the connection means.

16. The current detection circuit according to claim 13, comprising:

a fifth resistor that is provided with one end that is connected to the fifth node and another end where a second voltage is applied thereto; and a control circuit that controls on/off of the first and second switching elements in response to a voltage at the fifth node.

17. The current detection circuit according to claim 13, wherein the first and second switching elements are composed of PMOS transistors.

18. The current detection circuit according to claim 13, wherein the first and second switching elements are composed of NMOS transistors.

19. The current detection circuit according to claim 13, wherein the connection means is composed of a printed wiring.

20. The current detection circuit according to claim 13, wherein the first node is connected to a load.

* * * * *